United States Patent
Otsuki et al.

(10) Patent No.: US 9,425,065 B2
(45) Date of Patent: Aug. 23, 2016

(54) SEMICONDUCTOR DEVICE AND METHOD OF MANUFACTURE THEREOF

(71) Applicant: Mitsubishi Electric Corporation, Chiyoda-ku (JP)

(72) Inventors: Takami Otsuki, Tokyo (JP); Taichi Obara, Tokyo (JP); Akira Goto, Fukuoka (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 14/687,619

(22) Filed: Apr. 15, 2015

(65) Prior Publication Data
US 2015/0221525 A1 Aug. 6, 2015

Related U.S. Application Data

(62) Division of application No. 13/473,991, filed on May 17, 2012, now abandoned.

(30) Foreign Application Priority Data

Sep. 29, 2011 (JP) ................................ 2011-214412

(51) Int. Cl.
*H01L 21/48* (2006.01)
*H01L 23/498* (2006.01)
(Continued)

(52) U.S. Cl.
CPC ........... *H01L 21/4821* (2013.01); *B22D 19/00* (2013.01); *B22D 21/04* (2013.01);
(Continued)

(58) Field of Classification Search
CPC ..... H01L 24/49; H01L 25/162; H01L 25/50; H01L 23/49811; H01L 23/24; H01L 24/48; H01L 21/4821; H01L 2224/49; H01L 24/32

USPC ................... 257/76, 77, 678, 773, 288, 368; 438/646, 675, 98, 112
See application file for complete search history.

(56) References Cited

U.S. PATENT DOCUMENTS 5,942,797 A 8/1999 Terasawa
6,486,548 B1 11/2002 Nakatsu et al.
(Continued)

FOREIGN PATENT DOCUMENTS

JP 9-275211 A 10/1997
JP 2001-144234 5/2001
(Continued)

OTHER PUBLICATIONS

Combined Chinese Office Action and Search Report issued Jul. 7, 2015 in Patent Application No. 201210366786.X (with partial English translation and English translation of categories of cited documents).

(Continued)

*Primary Examiner* — Jarrett Stark
*Assistant Examiner* — Shahed Ahmed
(74) *Attorney, Agent, or Firm* — Oblon, McClelland, Maier & Neustadt, L.L.P.

(57) ABSTRACT

A semiconductor device includes an insulating substrate, a wiring pattern formed on the insulating substrate, a semiconductor chip secured to the wiring pattern, a junction terminal formed of the same material as the wiring pattern and electrically connected to the semiconductor chip, one end of the junction terminal being secured to the insulating substrate, the other end of the junction terminal extending upward away from the insulating substrate, and a control circuit for transmitting a control signal for the semiconductor chip, the control circuit being electrically connected to the junction terminal.

11 Claims, 6 Drawing Sheets

(51) Int. Cl.
*H01L 25/16* (2006.01)
*H01L 25/00* (2006.01)
*B22D 19/00* (2006.01)
*B22D 21/04* (2006.01)
*H01L 23/00* (2006.01)
*H01L 23/24* (2006.01)
*H01L 23/31* (2006.01)
*H01L 23/373* (2006.01)

(52) U.S. Cl.
CPC ......... *H01L23/49811* (2013.01); *H01L 24/49* (2013.01); *H01L 25/162* (2013.01); *H01L 25/50* (2013.01); H01L 23/24 (2013.01); H01L 23/3121 (2013.01); H01L 23/3735 (2013.01); H01L 24/32 (2013.01); H01L 24/48 (2013.01); H01L 2224/32225 (2013.01); H01L 2224/48091 (2013.01); H01L 2224/48137 (2013.01); H01L 2224/48247 (2013.01); H01L 2224/49 (2013.01); H01L 2224/73265 (2013.01); H01L 2924/00014 (2013.01); H01L 2924/13055 (2013.01); H01L 2924/181 (2013.01); H01L 2924/19107 (2013.01)

(56) References Cited

U.S. PATENT DOCUMENTS

| | | | |
|---|---|---|---|
| 8,593,817 | B2 | 11/2013 | Bayerer et al. |
| 2002/0153532 | A1 | 10/2002 | Sonobe et al. |
| 2004/0062009 | A1* | 4/2004 | Osanai ................ H01L 23/3735 361/709 |
| 2006/0108601 | A1 | 5/2006 | Okamoto |
| 2007/0246833 | A1 | 10/2007 | Soga et al. |
| 2009/0050957 | A1* | 2/2009 | Nakao ................... H01L 23/053 257/328 |
| 2009/0102040 | A1 | 4/2009 | Specht et al. |
| 2010/0133684 | A1 | 6/2010 | Oka et al. |
| 2011/0173804 | A1 | 7/2011 | Kirsch et al. |
| 2012/0112201 | A1 | 5/2012 | Otsuka et al. |
| 2012/0306086 | A1 | 12/2012 | Sugimura et al. |
| 2013/0001646 | A1 | 1/2013 | Corrion et al. |

FOREIGN PATENT DOCUMENTS

| | | |
|---|---|---|
| JP | 2002-315357 | 10/2002 |
| JP | 2003-229531 A | 8/2003 |
| JP | 2006-156994 A | 6/2006 |
| JP | 2006-192468 A | 7/2006 |
| JP | 2007-184315 A | 7/2007 |
| JP | 2009-10252 A | 1/2009 |
| JP | 2010-129868 A | 6/2010 |
| JP | 2011-14671 A | 1/2011 |
| WO | 98/12748 | 3/1998 |

OTHER PUBLICATIONS

Office Action issued Jun. 17, 2014 in Japanese Patent Application No. 2011-214412 (with partial English language translation).
Chinese Office Action dated Nov. 2, 2014 in corresponding Chinese patent application No. 201210366786X, with partial English translation.

* cited by examiner

SEMICONDUCTOR DEVICE AND METHOD OF MANUFACTURE THEREOF

CROSS-REFERENCE TO RELATED APPLICATION

This application is a divisional of U.S. application Ser. No. 13/473,991, filed on May 17, 2012, and is based upon and claims the benefit of priority from prior Japanese Patent Application No. 2011-214412, filed on Sep. 29, 2011 in Japan, the entire contents of each of which are incorporated herein by reference.

BACKGROUND OF THE INVENTION

1. Field of the Invention

The present invention relates to a semiconductor device used, e.g., for high power switching, etc., and a method of manufacture thereof.

2. Background Art

Japanese Laid-Open Patent Publication No. 2002-315357 discloses a semiconductor device in which metal plates serving as wiring patterns are formed on an insulating substrate. Connection terminals are secured to the wiring patterns and extend upward away from the insulating substrate. The connection terminals are used to connect the semiconductor device and external components.

The manufacturing process for the semiconductor device disclosed in the above publication is complicated, since the connection terminals are secured onto the wiring patterns. As a result, the semiconductor device disclosed in the publication is costly to produce.

SUMMARY OF THE INVENTION

The present invention has been made to solve the foregoing problem. It is, therefore, an object of the present invention to provide a semiconductor device suitable for being manufactured at a reduced cost, and a method of manufacture thereof.

The features and advantages of the present invention may be summarized as follows.

According to one aspect of the present invention, a semiconductor device includes an insulating substrate, a wiring pattern formed on the insulating substrate, a semiconductor chip secured to the wiring pattern, a junction terminal formed of the same material as the wiring pattern and electrically connected to the semiconductor chip, one end of the junction terminal being secured to the insulating substrate, the other end of the junction terminal extending upward away from the insulating substrate, and a control circuit for transmitting a control signal for the semiconductor chip, the control circuit being electrically connected to the junction terminal.

According to another aspect of the present invention, a semiconductor device includes an insulating substrate, a wiring pattern formed on the insulating substrate and including a first wiring pattern, a second wiring pattern, and a third wiring pattern, a semiconductor chip secured to the first wiring pattern, a junction terminal electrically connected to the semiconductor chip, one end of the junction terminal being embedded in the second wiring pattern, the other end of the junction terminal extending upward away from the insulating substrate, a control circuit for transmitting a control signal for the semiconductor chip, the control circuit being electrically connected to the junction terminal, and a power terminal electrically connected to the semiconductor chip, one end of the power terminal being embedded in the third wiring pattern, the other end of the power terminal extending upward away from the insulating substrate.

According to another aspect of the present invention, a method of manufacturing a semiconductor device, includes a step of placing an insulating substrate in a mold having a wiring pattern-forming cavity for forming a wiring pattern on the insulating substrate and also having a junction terminal-forming cavity for forming a junction terminal extending upward from the insulating substrate, an aluminum pouring step of pouring aluminum into the wiring pattern-forming cavity and the junction terminal-forming cavity, and a step of cooling the aluminum.

Other and further objects, features and advantages of the invention will appear more fully from the following description.

DETAILED DESCRIPTION OF THE PREFERRED EMBODIMENTS

First Embodiment

Figure 1:
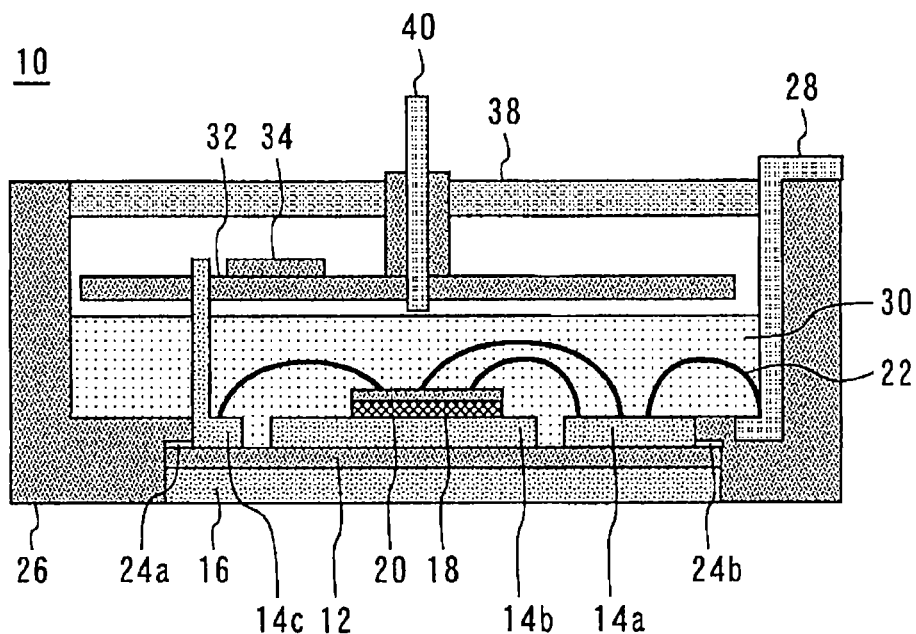
FIG. 1 is a cross-sectional view of a semiconductor device in accordance with a first embodiment of the present invention.

FIG. 1 is a cross-sectional view of a semiconductor device in accordance with a first embodiment of the present invention. The semiconductor device 10 includes an insulating substrate 12. The insulating substrate 12 is formed, e.g., of AlN, $Al_2O_3$, SiN, etc. Wiring patterns 14a and 14b are formed on the insulating substrate 12. A junction terminal 14c is also formed on the insulating substrate 12. One end of the junction terminal 14c is secured to the insulating substrate 12, and the other end of the junction terminal 14c extends upward away from the insulating substrate 12. The junction terminal 14c is formed of the same material as the wiring patterns 14a and 14b.

A bottom surface pattern 16 is formed on the bottom surface of the insulating substrate 12. The bottom surface pattern 16 and the wiring patterns 14a and 14b are formed of aluminum 1-5 mm thick. A semiconductor chip 20 is secured to the wiring pattern 14b by solder 18. The semiconductor chip 20 is configured, e.g., from an IGBT and a diode formed of silicon. The semiconductor chip 20 is electrically connected to the junction terminal 14c and the wiring pattern 14a by wires 22.

A case 26 is secured to the insulating substrate 12 by adhesives 24a and 24b. The case 26 is formed so as to outwardly expose the bottom pattern 16. A power terminal 28 is formed along an inner wall of the case 26. The power terminal 28 is electrically connected to the semiconductor chip 20 by wires 22.

Silicon gel 30 is disposed within the case 26. The silicon gel 30 seals the semiconductor chip 20. The junction terminal 14c and the power terminal 28 extend through and outwardly from the silicon gel 30. Outside the silicon gel 30, a control substrate 32 is connected to the junction terminal 14c. A control circuit 34 is secured to the control substrate 32. The control circuit 34 is electrically connected to the junction terminal 14c and transmits a control signal for the semiconductor chip 20. A cover 38 for the case 26 is mounted above the control substrate 32. A control terminal 40 is secured to the control substrate 32. The control terminal 40 extends through and outwardly from the cover 38.

Figure 2:
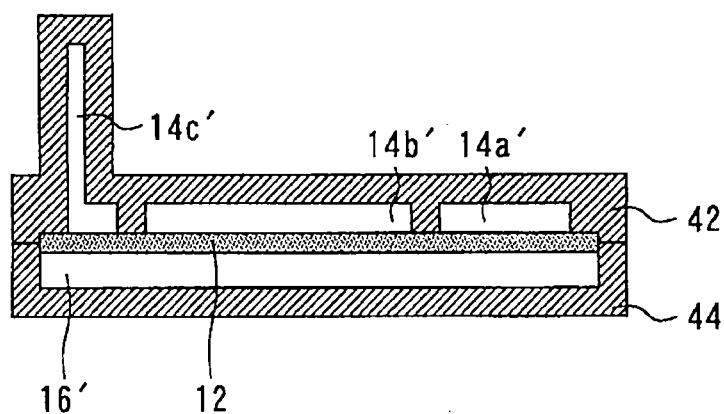
FIG. 2 is a diagram showing the molds, etc. used by the semiconductor device manufacturing method of the first embodiment.

A method of manufacturing a semiconductor device in accordance with the first embodiment will now be described. FIG. 2 is a diagram showing the molds, etc. used by the semiconductor device manufacturing method of the first embodiment. The wiring patterns 14a and 14b, the junction terminal 14c, the bottom pattern 16 described above are formed by casting. Specifically, they are formed by use of molds 42 and 44. The mold 42 has formed therein wiring pattern-forming cavities 14a' and 14b' for forming the wiring patterns 14a and 14b, respectively, on the insulating substrate 12. The mold 42 also has formed therein a junction terminal-forming cavity 14c' for forming the junction terminal 14c which extends upward from the insulating substrate. The mold 44 has formed therein a bottom surface pattern-forming cavity 16' for forming the bottom surface pattern 16. The following steps are performed using the molds 42 and 44.

First, the insulating substrate 12 is placed in a cavity formed by the molds 42 and 44. Molten aluminum is then poured into the wiring pattern-forming cavities 14a' and 14b', the junction terminal-forming cavity 14c', and the bottom surface pattern-forming cavity 16'. This step is referred to as the aluminum pouring step. Next, the poured aluminum is cooled. The molds 42 and 44 are then removed from the casting, i.e., the insulating substrate 12 having the wiring patterns 14a and 14b, the junction terminal 14c, and the bottom pattern 16 formed thereon. The semiconductor chip 20 is then soldered to the wiring pattern 14b, and then other steps are performed to form the semiconductor device 10 shown in FIG. 1.

The semiconductor device of the first embodiment is configured such that the junction terminal 14c can be formed at the same time as the wiring patterns 14a and 14b, etc. by casting. Therefore, the semiconductor device can be manufactured without the step of securing the junction terminal to a wiring pattern, making it possible to manufacture the semiconductor device at a reduced cost.

Second Embodiment

Figure 3:
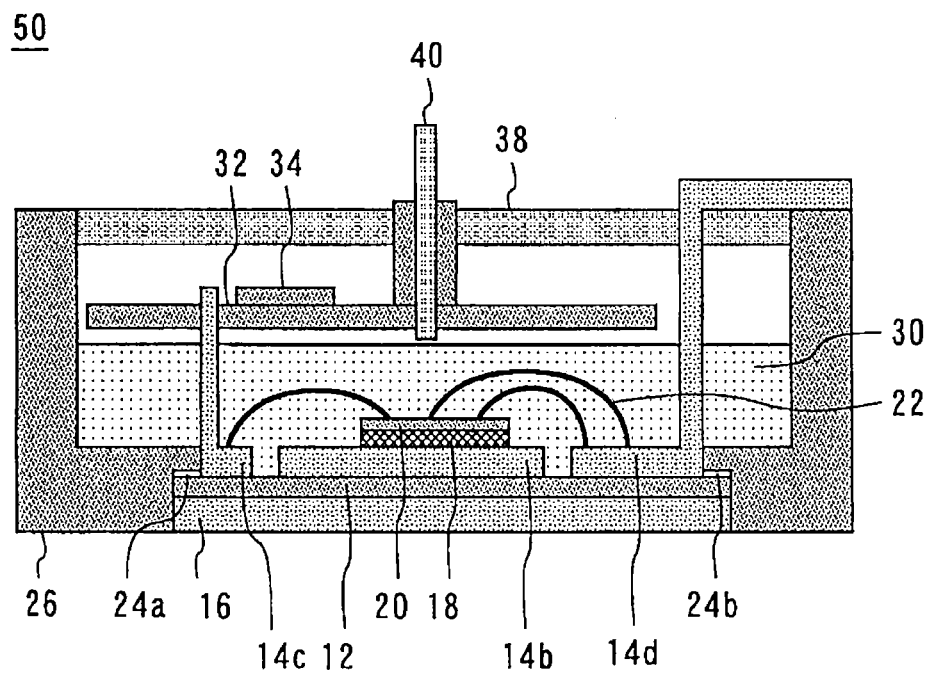
FIG. 3 is a cross-sectional view of the semiconductor device of the second embodiment.

A semiconductor device and a method of manufacture thereof in accordance with a second embodiment of the present invention have many features common to the first embodiment. Therefore, the following description of the semiconductor device and the method of the second embodiment will be primarily limited to the differences from the first embodiment. FIG. 3 is a cross-sectional view of the semiconductor device of the second embodiment. The semiconductor device 50 includes a power terminal 14d. One end of the power terminal 14d is secured to the insulating substrate 12, and the other end extends upward away from the insulating substrate 12. The power terminal 14d is formed of the same material (aluminum) as the wiring pattern 14b. That is, the power terminal 14d, the wiring pattern 14b, the junction terminal 14c, and the bottom pattern 16 are all formed of aluminum. It should be noted that the power terminal 14d is electrically connected to the semiconductor chip 20 by wires 22.

Figure 4:
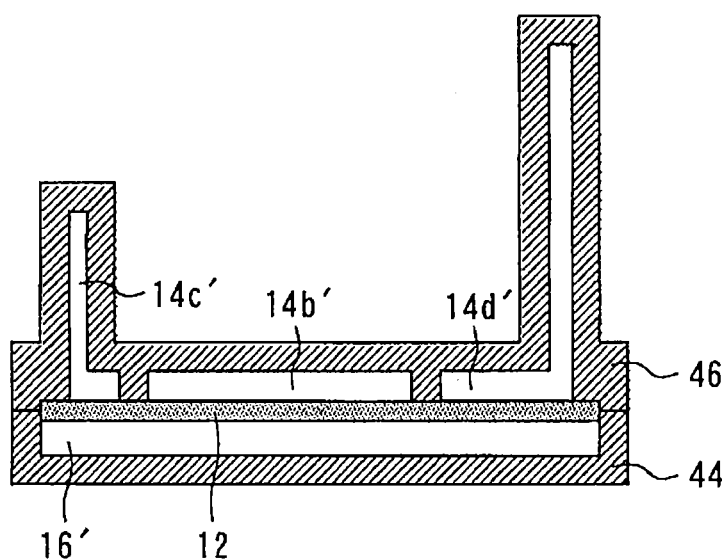
FIG. 4 is a diagram showing the molds, etc. used by the semiconductor device manufacturing method of the second embodiment.

The method of manufacturing a semiconductor device in accordance with the second embodiment will now be described. The semiconductor device manufacturing method of the second embodiment is basically similar to that of the first embodiment, but uses a mold of a different configuration. FIG. 4 is a diagram showing the molds, etc. used by the semiconductor device manufacturing method of the second embodiment. Specifically, a mold 46 has formed therein a power terminal-forming cavity 14d' for forming the power terminal 14d which extends upward from the insulating substrate 12. In the aluminum pouring step, molten aluminum is poured into the wiring pattern-forming cavity 14b', the junction terminal-forming cavity 14c', the power terminal-forming cavity 14d', and the bottom surface pattern-forming cavity 16'. It should be noted that the power terminal 14d which has been produced in the power terminal-forming cavity 14d' is not yet in its final shape. After the mold 46 is removed from the casting, the portion of the power terminal 14d extending straight upward from the insulating substrate 12 is bent into the desired shape, thereby completing the formation of the power terminal 14d. Thus, in the semiconductor device manufacturing method of the second embodiment, the wiring pattern 14b, the junction terminal 14c, the power terminal 14d, and the bottom surface pattern 16 are formed by casting in the molds 44 and 46.

The semiconductor device and the method of manufacture thereof in accordance with the second embodiment are configured such that the wiring pattern 14b, the junction terminal 14c, the power terminal 14d, and the bottom surface pattern 16 are cast at once. This simplifies the manufacturing process, making it possible to manufacture the semiconductor device at a reduced cost.

Third Embodiment

Figure 5:
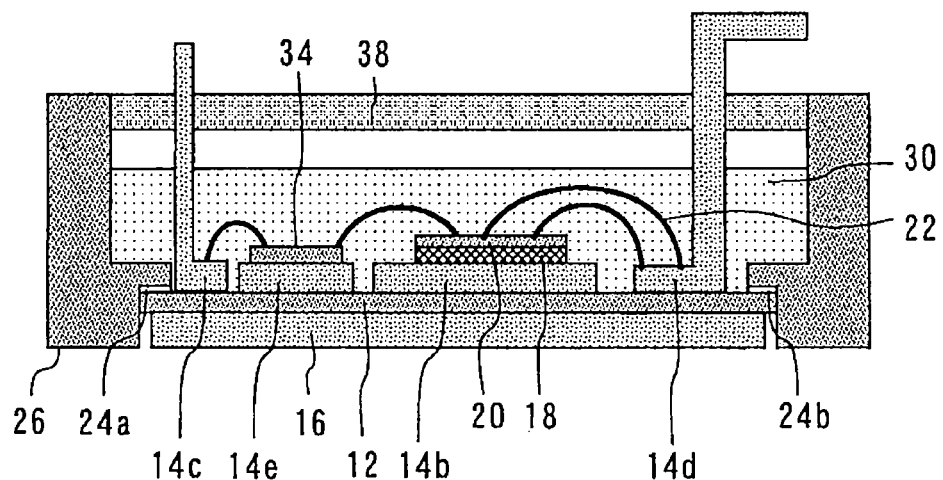
FIG. 5 is a cross-sectional view of the semiconductor device of the third embodiment.

A semiconductor device and a method of manufacture thereof in accordance with a third embodiment of the present invention have many features common to the first embodiment. Therefore, the following description of the semiconductor device and the method of the third embodiment will be primarily limited to the differences from the first embodiment. FIG. 5 is a cross-sectional view of the semiconductor device of the third embodiment. The semiconductor device 60 includes a control circuit wiring pattern 14e formed on the insulating substrate 12. The control circuit wiring pattern 14e is formed of the same material (aluminum) as the wiring pattern 14b. That is, the control circuit wiring pattern 14e, the power terminal 14d, the wiring pattern 14b, the junction terminal 14c, and the bottom surface pattern 16 are all formed of aluminum. A control circuit 34 is secured to the control circuit wiring pattern 14e. The control circuit 34 is connected to the semiconductor chip 20 and the junction terminal 14c by wires 22. Further, the control circuit 34 is sealed by silicon gel 30.

In the semiconductor device of the third embodiment, the control circuit 34 is secured to the control circuit wiring pattern 14e, thereby eliminating the need for a control substrate. Further, in order to allow the semiconductor chip to be connected to an external device, the semiconductor device of the third embodiment includes the junction terminal 14c which performs the function of both the junction terminal and the power terminal of the semiconductor device shown in FIG. 1. Therefore, the semiconductor device of the third embodiment can be manufactured at a reduced cost.

Fourth Embodiment

Figure 6:
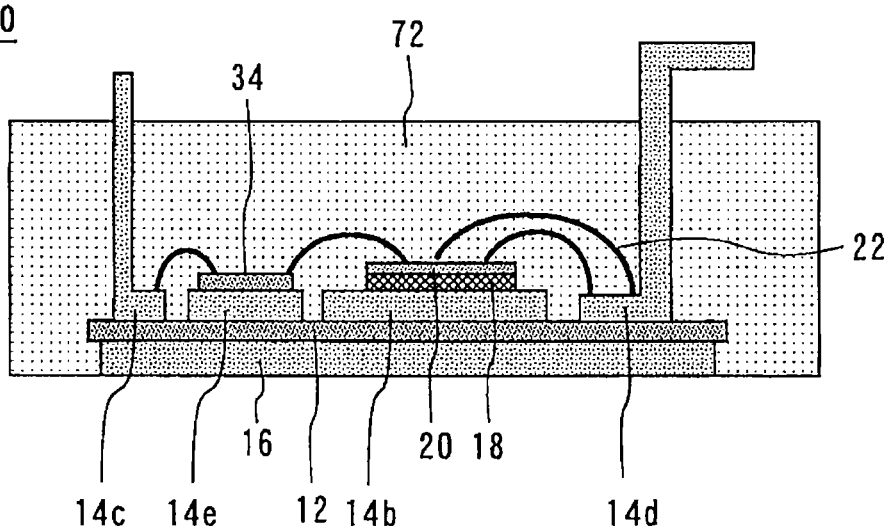
FIG. 6 is a cross-sectional view of the semiconductor device of the fourth embodiment.

A semiconductor device and a method of manufacture thereof in accordance with a fourth embodiment of the present invention have many features common to the third embodiment. Therefore, the following description of the semiconductor device and the method of the fourth embodiment will be primarily limited to the differences from the third embodiment. FIG. 6 is a cross-sectional view of the semiconductor device of the fourth embodiment. The semiconductor device 70 is provided with a molded resin 72. The molded resin 72 covers the insulating substrate 12, the wiring pattern 14b, the control circuit wiring pattern 14e, the semiconductor chip 20, the junction terminal 14c, the control circuit 34, and the power terminal 14d, and outwardly exposes the surface of the bottom surface pattern 16 opposite that in contact with the insulating substrate 12, the distal end of the junction terminal 14c, and the distal end of the power terminal 14d. The coefficient of linear expansion of the molded resin 72 is equal to that of the wiring pattern 14b (i.e., the coefficient of linear expansion of aluminum).

The semiconductor device 70 of the fourth embodiment is provided with the molded resin 72, which eliminates the need for a case, a cover, and silicon gel, such as those provided in the semiconductor device of the third embodiment, making it possible to manufacture the semiconductor device at a reduced cost. It should be noted that semiconductor devices of the type described herein are configured such that the bottom surface pattern on the bottom surface of the insulating substrate has a much larger surface area than the wiring patterns on the top surface of the insulating substrate. This means that the amount of aluminum on the bottom surface of the insulating substrate is much greater than that on the top surface of the insulating substrate. As a result it has been found in some cases that the insulating substrate warps convex upward due to the shrinkage of the bottom surface pattern caused by the cooling of the pattern after heating. In the case of the semiconductor device of the fourth embodiment, however, all the materials surrounding the insulating substrate have equal coefficients of linear expansion, since the coefficient of linear expansion of the molded resin 72 is equal to that of the wiring pattern 14b, making it possible to prevent warpage of the insulating substrate 12.

Although the constituent materials of the molded resin 72 have not been specified, it is to be understood that the molded resin 72 may be epoxy resin containing a filler such as glass or silica. The use of such a filler makes it easy to adjust the coefficient of linear expansion of the molded resin 72 to be equal to that of aluminum. Alternatively, the molded resin 72 may be an optimum type of resin for that purpose and does not contain filler. For example, the molded resin 72 may be phenol resin. It should be noted that the only requirement for the coefficient of linear expansion of the molded resin 72 is that it be sufficiently close to the coefficient of linear expansion of aluminum to prevent warpage of the insulating substrate 12. Therefore, the coefficient of linear expansion of the molded resin 72 need not be equal to that of aluminum if it is possible to prevent warpage of the insulating substrate 12.

Fifth Embodiment

Figure 7:
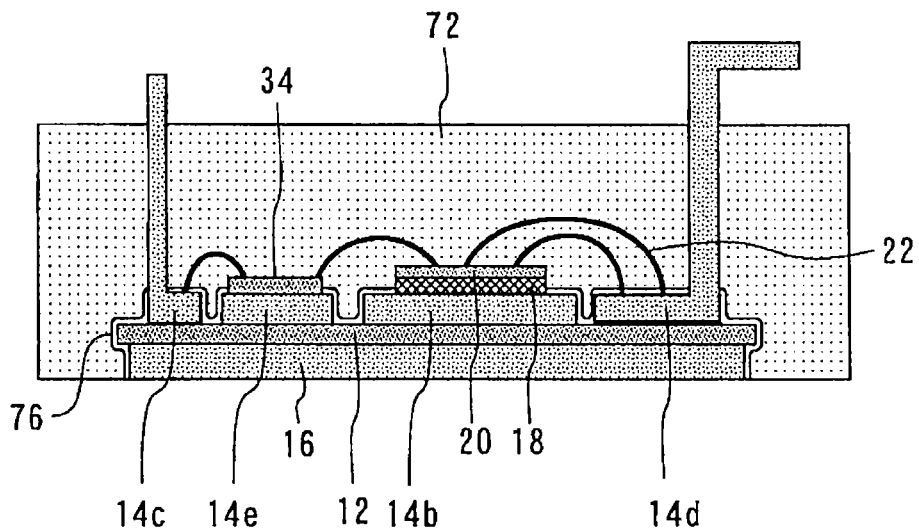
FIG. 7 is a cross-sectional view of the semiconductor device of the fifth embodiment.

A semiconductor device and a method of manufacture thereof in accordance with a fifth embodiment of the present invention have many features common to the fourth embodiment. Therefore, the following description of the semiconductor device and the method of the fifth embodiment will be primarily limited to the differences from the fourth embodiment. FIG. 7 is a cross-sectional view of the semiconductor device of the fifth embodiment. The semiconductor device 74 includes an adhesive primer 76 formed on the surface of the wiring patterns (of aluminum) and on the surface of the insulating substrate 12. The adhesive primer 76 serves to increase the adhesion between the molded resin 72 and the insulating substrate 12. Thus in the semiconductor device of the fifth embodiment, substantial adhesion between the molded resin 72 and the insulating substrate 12 is ensured by use of the adhesive primer 76.

Sixth Embodiment

Figure 8:
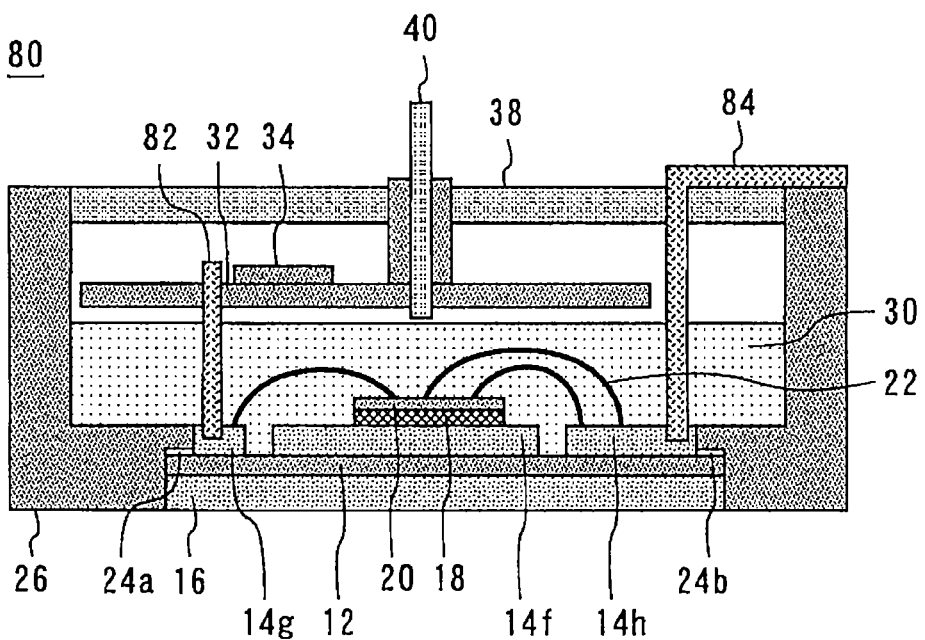
FIG. 8 is a cross-sectional view of the semiconductor device of the sixth embodiment.

A semiconductor device and a method of manufacture thereof in accordance with a sixth embodiment of the present invention have many features common to the first embodiment. Therefore, the following description of the semiconductor device and the method of the sixth embodiment will be primarily limited to the differences from the first embodiment. FIG. 8 is a cross-sectional view of the semiconductor device of the sixth embodiment. The semiconductor device 80 is characterized in that one end of a junction terminal 82 and one end of a power terminal 84 are embedded in their respective wiring patterns.

The insulating substrate 12 has a first wiring pattern 14f, a second wiring pattern 14g, and a third wiring pattern 14h formed thereon. The first wiring pattern 14f, the second wiring pattern 14g, and the third wiring pattern 14h are sometimes hereinafter referred to collectively as the "wiring patterns." The semiconductor chip 20 is secured onto the first wiring pattern 14f.

The semiconductor device 80 is provided with the junction terminal 82. One end of the junction terminal 82 is embedded in the second wiring pattern 14g, and the other end of the junction terminal 82 extends upward away from the insulating substrate 12 and is connected to the control substrate 32. The junction terminal 82 is electrically connected to the semiconductor chip 20 by way of the second wiring pattern 14g and a wire 22. The control circuit 34, which transmits a control signal for the semiconductor chip 20, is electrically connected to the other end (i.e., the distal end) of the junction terminal 82.

The semiconductor device 80 is also provided with the power terminal 84. One end of the power terminal 84 is embedded in the third wiring pattern 14h, and the other end of the power terminal 84 extends upward away from the insulating substrate 12. The power terminal 84 is electrically connected to the semiconductor chip 20.

Figure 9:
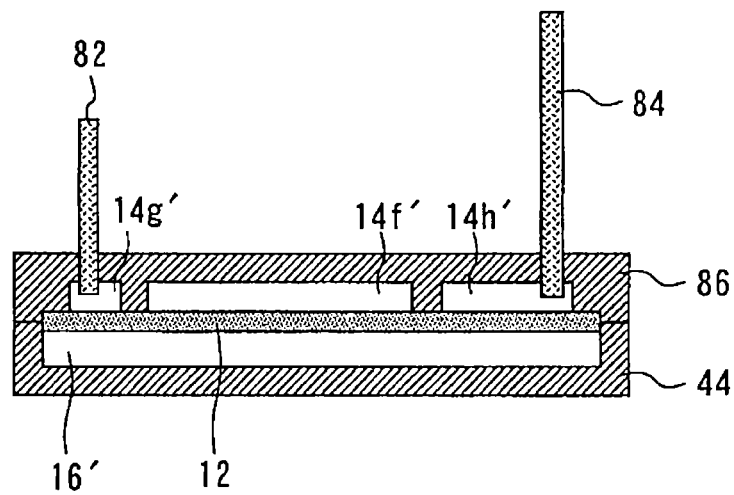
FIG. 9 is a diagram showing the molds, etc. used by the semiconductor device manufacturing method of the sixth embodiment.

FIG. 9 is a diagram showing the molds, etc. used by the semiconductor device manufacturing method of the sixth embodiment. Specifically, the method uses the mold 44 (described above in connection with the first embodiment) and a mold 86. The mold 86 has formed therein a first wiring pattern-forming cavity 14f' for forming the first wiring pattern 14f, a second wiring pattern-forming cavity 14g' for forming the second wiring pattern 14g, and a third wiring pattern-forming cavity 14h' for forming the third wiring pattern 14h. The first wiring pattern 14f, the second wiring pattern 14g, the third wiring pattern 14h, and the bottom surface pattern 16 are formed on the insulating substrate 12 using the molds 44 and 86. More specifically, molten aluminum is poured into the molds 44 and 86 with the junction terminal 82 and the power terminal 84 inserted into the mold 86 so that one end of the junction terminal 82 is embedded into the second wiring pattern 14g and one end of the power terminal 84 is embedded into the third wiring pattern 14h. It should be noted that when the mold 86 has been removed from the casting, the power terminal 14d is not yet in its final shape and extends straight upward from the insulating substrate 12. Therefore, after the removal of the mold 86, the power terminal 14d is bent into its final shape.

The semiconductor device and the method of manufacture thereof in accordance with the sixth embodiment are configured such that the junction terminal 82 and the power terminal 84 are secured to wiring patterns at the same time as when the wiring patterns are formed, making it possible to simplify the manufacturing process. It should be noted that it has been found difficult to form, at a reasonable cost, a mold for forming a junction terminal and a power terminal if these terminals have a complicated shape. In the semiconductor device and the method of manufacture thereof in accordance with the sixth embodiment, however, the junction terminal and the power terminal are embedded in wiring patterns, thereby eliminating the need to match the shape of the molds to that of the junction terminal and the power terminal. This makes it possible to manufacture semiconductor devices having a junction terminal and a power terminal of a complicated configuration by a simple process.

Figure 10:
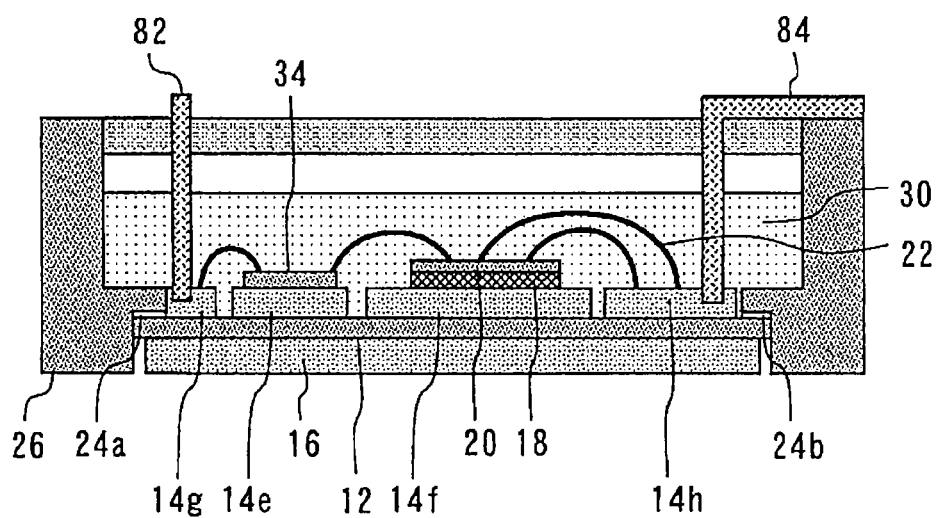
FIG. 10 is a cross-sectional view showing a semiconductor device in which a control circuit is secured onto a wiring pattern.
Figure 11:
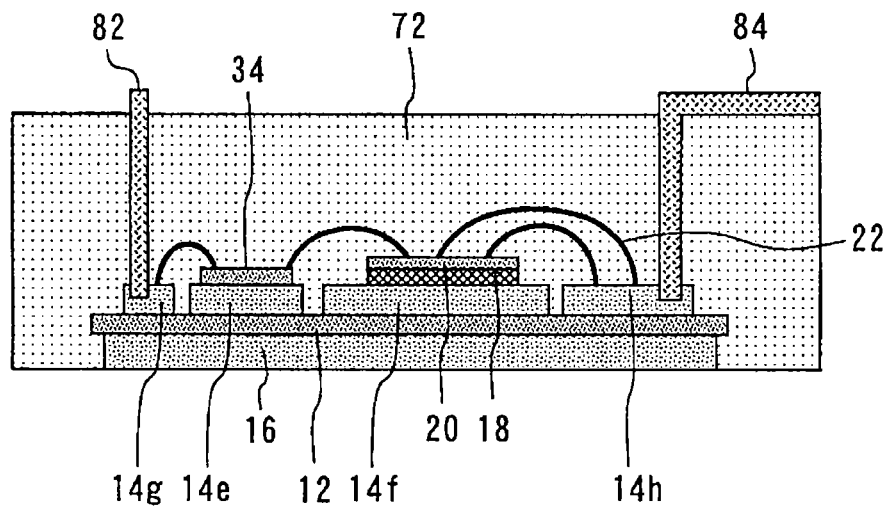
FIG. 11 is a cross-sectional view showing a semiconductor device provided with a molded resin.
Figure 12:
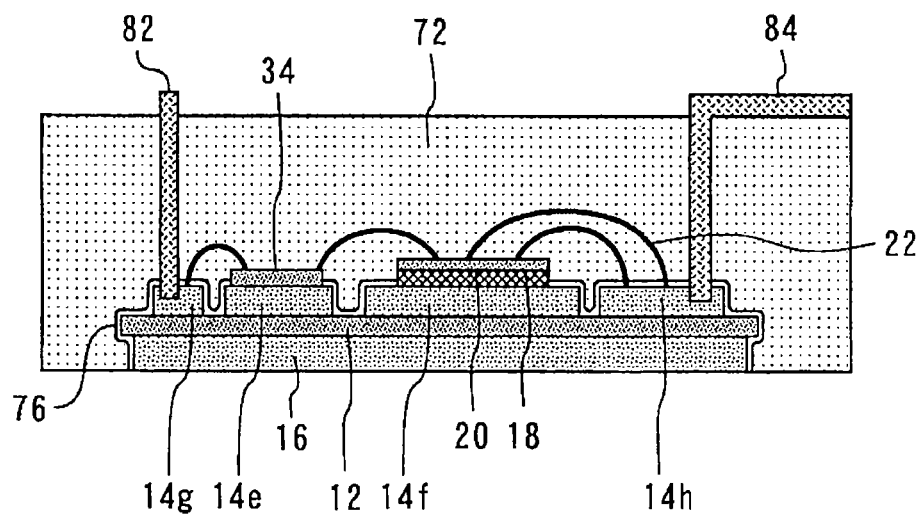
FIG. 12 is a cross-sectional view showing a semiconductor device provided with an adhesive primer.

The semiconductor device and the method of manufacture thereof in accordance with the sixth embodiment may be combined with the above-described various techniques to further reduce cost. FIG. 10 is a cross-sectional view showing a semiconductor device in which a control circuit is secured on to a wiring pattern. This configuration does not require a control substrate, resulting in a reduced cost. FIG. 11 is a cross-sectional view showing a semiconductor device provided with a molded resin. The use of the molded resin 72 eliminates the need for a case, a cover, and silicon gel, such as those provided in the semiconductor device of the first embodiment, resulting in a reduced cost. FIG. 12 is a cross-sectional view showing a semiconductor device provided with an adhesive primer. This configuration results in improved reliability, as compared to the configuration shown in FIG. 11.

Although in the first to sixth embodiments described above the semiconductor chip 20 is formed of silicon, it is to be understood that it may be formed of a wide bandgap semiconductor having a wider bandgap than silicon. Examples of wide bandgap semiconductors include silicon carbide, gallium nitride-based materials, and diamond. IGBTs and diodes formed of wide bandgap semiconductor have a high maximum allowable current density, making it possible to reduce their size.

In accordance with the present invention, there are provided semiconductor devices suitable for being manufactured at a reduced cost, and a method of manufacture thereof.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-214412, filed on Sep. 29, 2011 including specification, claims, drawings and summary, on which the Convention priority of the present application is based, are incorporated herein by reference in its entirety.

What is claimed is:

1. A method of manufacturing a semiconductor device, comprising:
placing an insulating substrate in at least one mold having at least one wiring pattern-forming cavity for forming a wiring pattern directly on said insulating substrate, and also having a junction terminal-forming cavity for forming a junction terminal directly on said insulating substrate and extending upward from said insulating substrate;
pouring aluminum into the at least one wiring pattern-forming cavity and into the junction terminal-forming cavity, the poured aluminum being at least partially molten aluminum; and
cooling the poured aluminum, thereby forming at a same time both the wiring pattern and the junction terminal directly on said insulating substrate, the junction terminal having an uninterrupted microstructure from one end formed directly on said insulating substrate to another end extending upward from said insulating substrate.

2. The method according to claim 1,
wherein the at least one mold has a power terminal-forming cavity for forming a power terminal directly on said insulating substrate and extending upward from said insulating substrate,
wherein the pouring includes pouring the aluminum into said power terminal-forming cavity, and
wherein the cooling the poured aluminum includes forming the power terminal at the same time as both the wiring pattern and the junction terminal directly on said insulating substrate.

3. The method according to claim 2, wherein the power terminal has an uninterrupted microstructure from one end formed directly on said insulating substrate to another end extending upward from said insulating substrate.

4. The method according to claim 3,
wherein the at least one mold has a bottom surface pattern-forming cavity for forming a bottom surface pattern directly on said insulating substrate on a side thereof opposite to the wiring pattern-forming cavity,
wherein the pouring includes pouring the aluminum into said bottom surface pattern-forming cavity, and
wherein the cooling the poured aluminum includes forming the bottom surface pattern at the same time as the wiring pattern, the junction terminal, and the power terminal, directly on said insulating substrate.

5. The method according to claim 4, further comprising providing a molded resin covering the insulating substrate, the wiring pattern, the junction terminal, and the power terminal, the molded resin outwardly exposing said another end of the junction terminal, said another end of the power terminal, and a surface of the bottom surface pattern that is opposite that which is formed directly on said insulating substrate.

6. The method according to claim 4, further comprising forming an adhesive primer on a surface of the wiring pattern, a surface of the insulating substrate, and at least one of a surface of the junction terminal, a surface of the power terminal, and a surface of the bottom surface pattern.

7. The method according to claim 5, wherein a coefficient of linear expansion of the molded resin is equal to a coefficient of linear expansion of the wiring pattern.

8. The method according to claim 1, further comprising securing a semiconductor chip to the formed wiring pattern.

9. The method according to claim 1, wherein an aspect ratio of the junction terminal from the one end to the another end is greater than or equal to 2.

10. The method according to claim 2, wherein an aspect ratio of the power terminal from the one end to the another end is greater than or equal to 2.

11. The method according to claim 3, further comprising, after the forming the power terminal, bending the power terminal at a region thereof closer to the another end than to the one end.

* * * * *